(12) United States Patent
Chu et al.

(10) Patent No.: US 7,772,135 B2
(45) Date of Patent: Aug. 10, 2010

(54) METHOD FOR FORMING POLY-SILICON FILM

(75) Inventors: Fang-Tsun Chu, Taichung County (TW); Jla-Xing Lin, Taipei County (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 415 days.

(21) Appl. No.: 11/601,689

(22) Filed: Nov. 20, 2006

(65) Prior Publication Data

US 2007/0269993 A1    Nov. 22, 2007

(30) Foreign Application Priority Data

May 16, 2006    (TW) .............................. 95117215 A

(51) Int. Cl.
*H01L 21/00* (2006.01)
(52) U.S. Cl. ............... 438/799; 438/487; 257/E21.328; 257/E21.347; 257/E21.349; 117/204
(58) Field of Classification Search ................. 438/487, 438/151, 22, 799; 257/E21.349, E21.347, 257/E21.328; 117/204, 904
See application file for complete search history.

(56) References Cited

U.S. PATENT DOCUMENTS

| 5,119,113 | A  | * | 6/1992 | Prakash et al. ............... 347/241 |
| 6,163,405 | A  | * | 12/2000 | Chang et al. ................ 359/599 |
| 6,322,625 | B2 |  | 11/2001 | Im |
| 6,908,835 | B2 |  | 6/2005 | Sposili et al. |
| 2003/0194613 | A1 | * | 10/2003 | Voutsas et al. .................. 430/5 |
| 2005/0003591 | A1 | * | 1/2005 | Takaoka et al. ............. 438/151 |
| 2005/0070035 | A1 | * | 3/2005 | Yazaki et al. ................. 438/22 |
| 2009/0156018 | A1 | * | 6/2009 | You ........................... 438/795 |

* cited by examiner

*Primary Examiner*—Caridad M Everhart
(74) *Attorney, Agent, or Firm*—Birch, Stewart, Kolasch & Birch, LLP

(57) ABSTRACT

A method for forming a poly-silicon film, using sequential lateral solidification (SLS) by laser irradiation through an optical device to pattern the laser beam and provide a periodic energy profile on the edges of transparent regions so as to widen the poly-silicon grains and achieve grain size uniformity. The optical device comprises a plurality of first transparent regions with a length of L, wherein at least one side of the edge of each of the first transparent regions has a first periodic shape.

21 Claims, 16 Drawing Sheets

METHOD FOR FORMING POLY-SILICON FILM

BACKGROUND OF THE INVENTION

1. Field of the Invention

The present invention generally relates to a method for forming a poly-silicon (p-Si) film and, more particularly, to a method using sequential lateral solidification (SLS) by laser irradiation through an optical device (for example, a mask or a micro-slit array) to pattern the laser beam and provide a periodic energy profile of the edge of the laser beam passing through the optical device so as to widen the poly-silicon grains and achieve grain size uniformity.

2. Description of the Prior Art

In semiconductor manufacturing, amorphous silicon (a-Si) thin-film transistors (TFTs) are now widely used in the liquid crystal display (LCD) industry because amorphous silicon films can be deposited on a glass substrate at low temperatures. However, the carrier mobility in an amorphous silicon film is much lower than that in a poly-silicon (p-Si) film, so that conventional amorphous silicon TFT-LCDs exhibit low driving current that limits applications for LCD devices with high integrated circuits. Accordingly, there have been lots of reports on converting low-temperature deposited amorphous silicon films into poly-silicon films using laser crystallization.

Presently, poly-silicon films are gradually used in advanced electronic devices such as solar cells, LCDs and organic light-emitting devices (OLEDs). The quality of a poly-silicon film depends on the size of the poly-silicon grains that form the poly-silicon film. It is thus the greatest challenge to manufacture poly-silicon films having large grains with high throughput.

Grain boundary distribution in the poly-silicon film produced by sequential lateral solidification (SLS) exhibits excellent periodicity. FIG. 1A is a conventional system for forming a poly-silicon film using SLS. The system comprises: a laser generator 11 for generating a laser beam 12 and an optical device 13 disposed in a traveling path of the laser beam 12. The optical device 13 has a plurality of transparent regions 13a and a plurality of opaque regions 13b. The optical device 13 is implemented using a mask or a micro-slit array. Each of the plurality of transparent regions 13a is a stripe region with a width W. The laser beam 12 passing through the transparent regions 13a irradiates an amorphous silicon film 15 on the substrate 14 in back of the optical device 13 so as to melt the amorphous silicon film 15 in the stripe regions 15a with a width W. As the laser beam 12 is removed, the melted amorphous silicon film 15 in the stripe regions 15a starts to solidify and re-crystallize to form laterally grown silicon grains. Primary grain boundaries 16 parallel to a long side of the stripe regions 15a are thus formed at the center of the stripe regions 15a and a poly-silicon film is formed to have crystal grains with a grain length equal to a half of the width W, as shown in FIG. 1B.

In order to enhance the throughput, U.S. Pat. No. 6,908,835 discloses a method for forming a poly-silicon film using sequential lateral solidification (SLS) with two laser irradiations. In U.S. Pat. No. 6,908,835, an optical device is used to pattern the laser beam and thus control the grain length, as shown in FIG. 2A and FIG. 2C.

In FIG. 2A, the optical device 20 comprises a plurality of first stripe-shaped transparent regions 21 and a plurality of second stripe-shaped transparent regions 22 so that an amorphous silicon film (not shown) on a substrate (not shown) in back of the optical device 20 undergoes two laser irradiations while moving relatively to the optical device 20 along X-axis. In FIG. 2B, it is given that each of the first and the second transparent regions 21 and 22 has a width W. The spacing between two adjacent first transparent regions 21 and between two adjacent second transparent regions 22 is S. An offset width OS appears between the first transparent regions and the second transparent regions, where $OS \geq \frac{1}{2} W$. Therefore, the distance $\lambda$ between a first primary grain boundary (corresponding to a central line 211 in the first transparent regions 21) obtained after SLS using the first laser irradiation and a second primary grain boundary (corresponding to a central line 221 in the first transparent regions 22) obtained after SLS using the second laser irradiation is $\lambda=(W+S)/2$.

In practical cases, however, the system for forming a poly-silicon film in FIG. 1A can further comprise a projection lens apparatus (not shown) disposed on the traveling path of the laser beam 12 between the substrate 14 and the optical device 13. Given that the projection lens apparatus has an amplification factor of N, the grown poly-silicon film has crystal grains that have a grain length of $\lambda/N$. For example, if W=27.51 m, S=7.5 μm and N=5, the grain length of the poly-silicon film is $\lambda/N=[(W+S)/2]/5=3.5$ μm, as shown in FIG. 2C.

Using SLS with the aforesaid specially designed optical device, a poly-silicon film with periodically arranged poly-silicon grains is manufactured. The grains have a length of 3~10 μm and a width of only 0.3~0.5 μm. Accordingly, by increasing the grain width of the poly-silicon grains, the number of grain boundaries per unit area is further reduced so as to significantly improve the electrical characteristics of the think-film transistors using poly-silicon due to the higher carrier mobility and the higher turn-on current.

U.S. Pat. No. 6,322,625 discloses a method for forming a poly-silicon thin film using sequential lateral solidification (SLS) with two laser irradiations as shown in FIG. 3A to FIG. 3F. In FIG. 3A, an optical device (not shown) is used to define a first chevron-shaped region 31 in the amorphous silicon film 30 on the substrate. A first laser irradiation is performed on the first chevron-shaped region 31 to melt the amorphous silicon film 30, as shown in FIG. B. After the laser beam is removed, the melted amorphous silicon is solidified from the edge to form a poly-silicon region 311 and a primary boundary or a nucleus region 312, as shown in FIG. 3C. Then, in FIG. 3D, the substrate is moved with respect to the optical device so as to define a second chevron-shaped region 32, wherein the second chevron-shaped region 32 comprises the primary boundary or the nucleus region 312. A second laser irradiation is performed on the second chevron-shaped region 32 to melt both the Si film (comprising amorphous silicon and poly-silicon portions) in the second chevron-shaped region 32, as shown in FIG. 3E. After the laser beam is removed, the melted Si film in the second chevron-shaped region 32 is solidified from the edge to form a poly-silicon region 321 and thus a poly-silicon grain 33 with a larger width is formed at the tip of the first chevron-shaped region 31, as shown in FIG. 3F.

However, the aforesaid method is only useful when forming a wider poly-silicon grain at the tip of a chevron-shaped region and tends to cause serious uniformity issues.

Therefore, there exists a need in providing a method for forming a poly-silicon film using sequential lateral solidification (SLS) by laser irradiation through an optical device to pattern the laser beam and provide a periodic energy profile of the edge of the laser beam passing through the optical device so as to widen the poly-silicon grains and achieve grain size uniformity.

SUMMARY OF THE INVENTION

It is a primary object of the present invention to provide a method for forming a poly-silicon (p-Si) film and, more particularly, to a method using sequential lateral solidification by laser irradiation through an optical device to pattern the laser beam and provide a periodic energy profile of the edge of the laser beam passing through the optical device so as to widen the poly-silicon grains.

It is a secondary object of the present invention to provide a method for forming a poly-silicon (p-Si) film and, more particularly, to a method using sequential lateral solidification by laser irradiation through an optical device to pattern the laser beam and provide a periodic energy profile of the edge of the laser beam passing through the optical device so as to achieve grain size uniformity.

In order to achieve the foregoing object, the present invention provides a method for forming a poly-silicon (p-Si) film, the method comprising steps of:

(a) providing a system for forming a poly-silicon film, comprising
  a laser generator for generating a laser beam; and
  an optical device disposed in a traveling path of the laser beam so as to provide a periodic energy profile of the edge of the laser beam passing through the optical device;
(b) providing a substrate with an amorphous silicon film formed thereon behind the optical device in the traveling path of the laser beam;
(c) performing a first laser irradiation process on the substrate using the laser beam irradiating through the optical device so as to melt the amorphous silicon film in irradiated regions; and
(d) removing the laser beam such that the melted amorphous silicon film in the irradiated regions solidifies to form poly-silicon regions.

Preferably, the method for forming a poly-silicon (p-Si) film of the present invention further comprises steps of:

(e) moving the substrate;
(f) performing a second laser irradiation process on the substrate using the laser beam irradiating through the optical device so as to melt the amorphous silicon film in irradiated regions and the solidified poly-silicon regions; and
(g) removing the laser beam such that the melted amorphous silicon film and poly-silicon regions in the irradiated regions solidify to form poly-silicon regions.

Preferably, the method for forming a poly-silicon (p-Si) film of the present invention further comprises between step (d) and step (e) steps of:

(d1) moving the substrate;
(d2) performing an extended laser irradiation process on the substrate using the laser beam irradiating through the optical device so as to melt the amorphous silicon film in irradiated regions and the solidified poly-silicon regions; and
(d3) removing the laser beam such that the melted amorphous silicon film and poly-silicon regions in the irradiated regions solidify to form poly-silicon regions.

The present invention further provides an optical device for forming a poly-silicon film, the optical device comprising: a plurality of first transparent regions, each of the first transparent regions having a first periodic shape on at least an edge region.

Preferably, the optical device for forming a poly-silicon film of the present invention further comprises: a plurality of second transparent regions, each of the second transparent regions having a second periodic shape on at least an edge region; wherein the plurality of first transparent regions and the plurality of second transparent regions are arranged in a tier-shape.

Preferably, the optical device for forming a poly-silicon film of the present invention further comprises: at least a plurality of extended transparent regions, each of the extended transparent regions having a third periodic shape on at least an edge region; wherein the plurality of extended transparent regions are disposed between the plurality of first transparent regions and the plurality of second transparent regions so that the plurality of first transparent regions, the plurality of extended transparent regions and the plurality of second transparent regions are arranged in a tier-shape.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE PREFERRED EMBODIMENT

The present invention providing a method for forming a poly-silicon film can be exemplified by the preferred embodiments as described hereinafter.

In the present invention, sequential lateral solidification (SLS) by laser irradiation through an optical device is used to pattern the laser beam and provide a periodic energy profile of the edge of the laser beam passing through the optical device so as to widen the poly-silicon grains and achieve grain size uniformity.

Figure 4A:
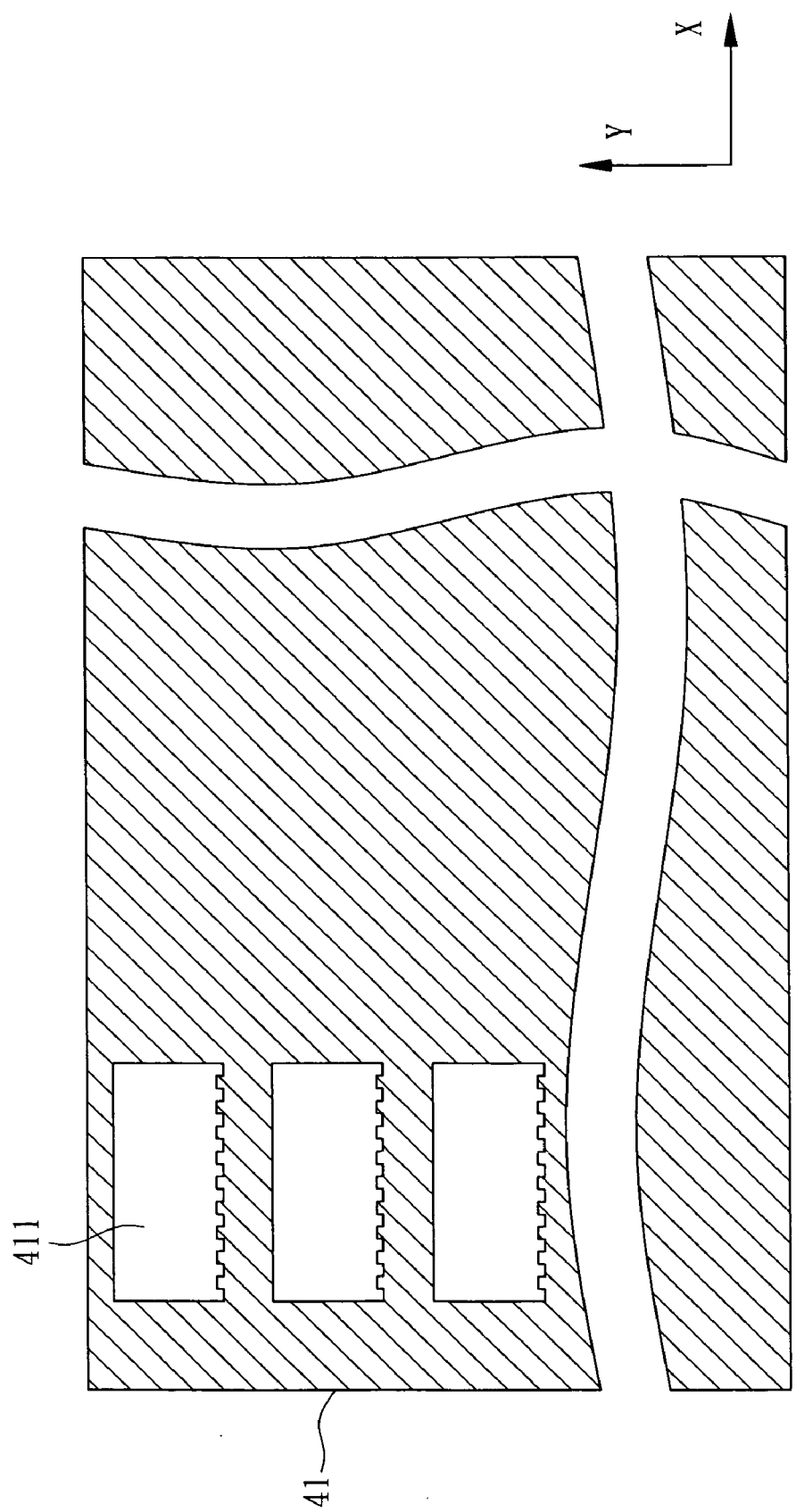
FIG. 4A and FIG. 4B are top views of optical device used in a method for forming a poly-silicon film according to a first embodiment of the present invention.
Figure 4B:
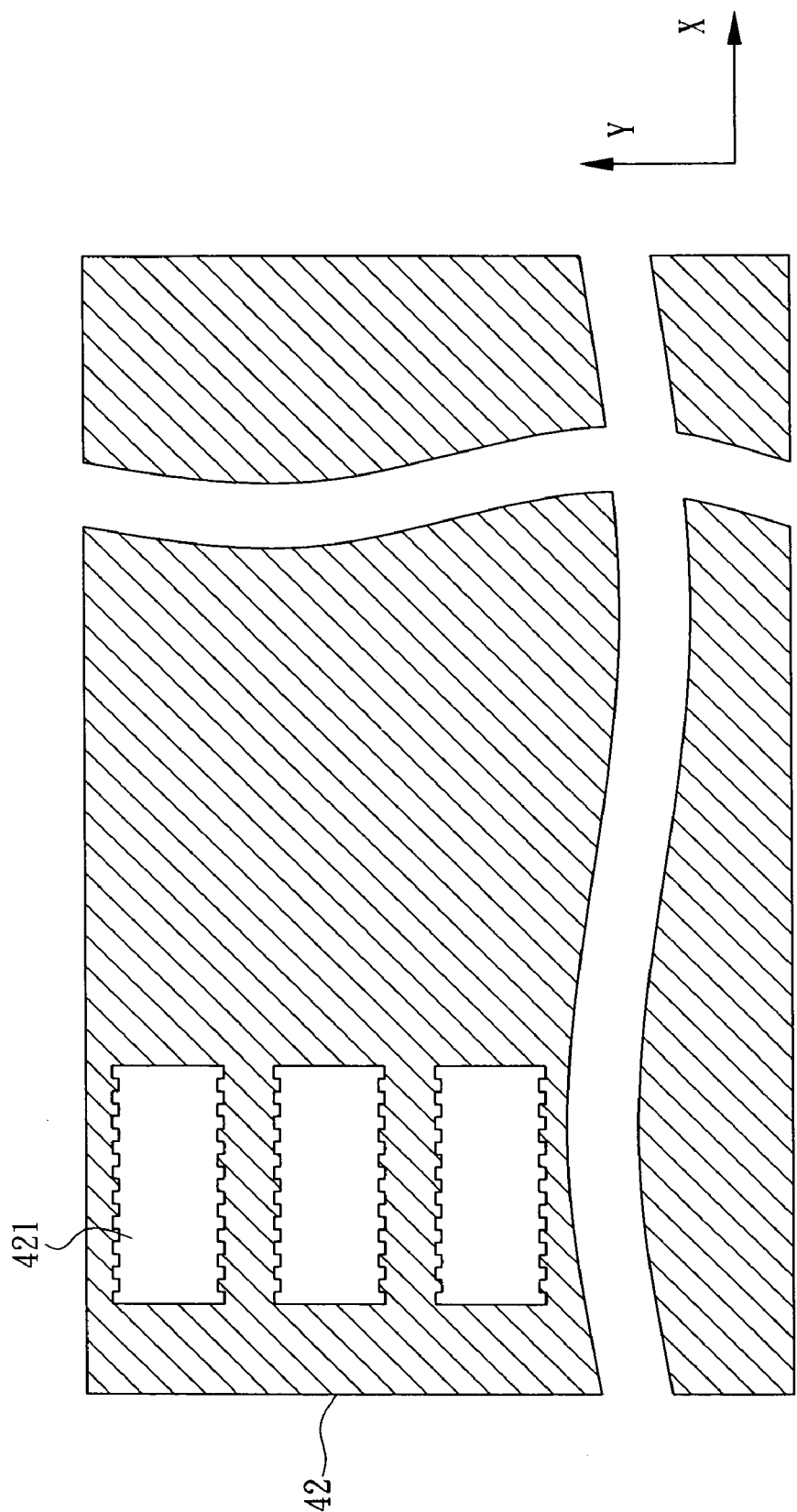

FIG. 4A and FIG. 4B are top views of optical devices used in a method for forming a poly-silicon film according to a first embodiment of the present invention. In FIG. 4A, the optical device 41 (for example, a mask or a micro-slit array) comprises a plurality of first transparent regions 411, each of the first transparent regions 411 having a first periodic shape on an edge region. Alternatively, as shown in FIG. 4B, the optical device 42 (for example, a mask or a micro-slit array) comprises a plurality of first transparent regions 421, each of the first transparent regions 421 having a first periodic shape on each of two opposite edge regions.

Figure 4C:
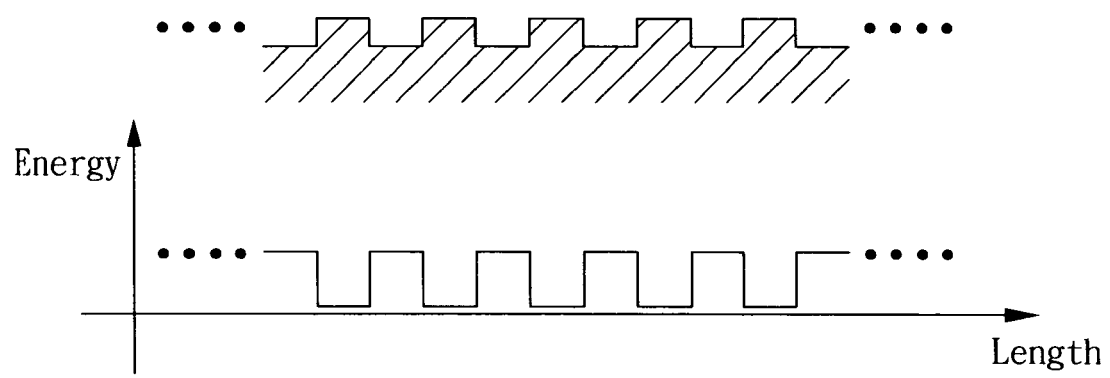
FIG. 4C shows a periodic shape and a periodic energy profile of the edge of the laser beam passing through the optical device according to FIG. 4A and FIG. 4B.

The transparent regions of a conventional optical device are not provided with a periodic shape on the edge regions. When the melted silicon film is solidified, there are nucleation sites randomly distributed on the silicon film in the regions corresponding to the edge regions. Therefore, the width of poly-silicon grains by conventional SLS is only 0.3~0.5 μm and the grain size is not uniform. On the contrary, using the optical device in the first embodiment of the present invention to manufacture poly-silicon thin films by SLS, there is provided a periodic energy profile of the edge of the laser beam passing through the edge regions of the transparent regions of the optical device, as shown in FIG. 4C. Therefore, when the melted silicon film is solidified, the nucleation sites are controllably positioned so as to widen the poly-silicon grains and achieve grain size uniformity.

Figure 5A:
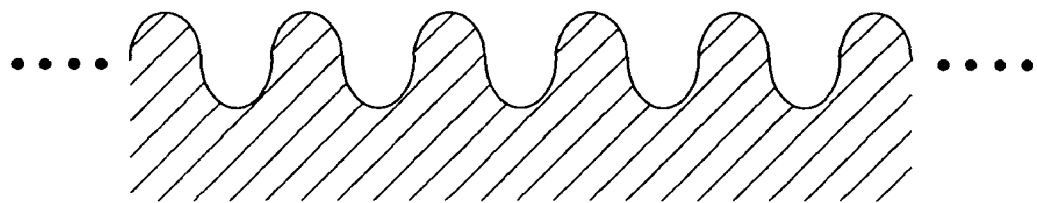
FIG. 5A to FIG. 5D are various examples of the periodic shape on the edge of the transparent region of an optical device of the present invention.
Figure 5B:
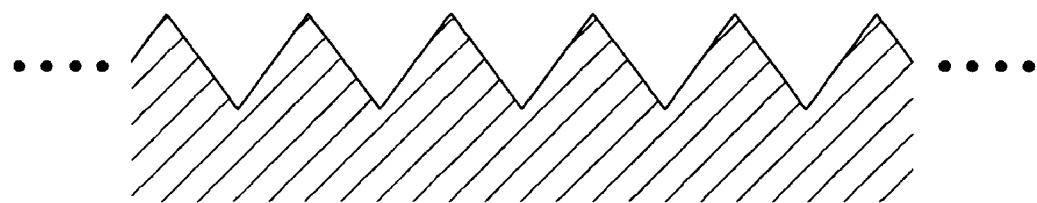
Figure 5C:
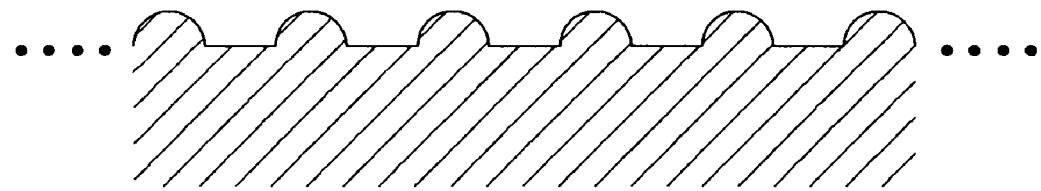
Figure 5D:
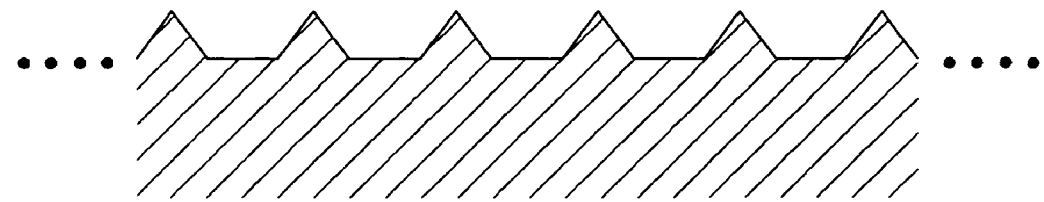

FIG. 5A to FIG. 5D are various examples of the periodic shape on the edge of the transparent region of an optical device of the present invention. FIG. 5A and FIG. 5B show respectively an example of a full-wave shape—a sine-wave shape and a triangular-wave shape. FIG. 5C and FIG. 5D show respectively an example of a half-wave shape—a sine-wave shape and a triangular-wave shape. The aforesaid examples are only exemplary and people with ordinary skills in the art can make various modifications, for example a zigzag shape and a sawtooth shape, within the scope of the present invention.

Figure 6:
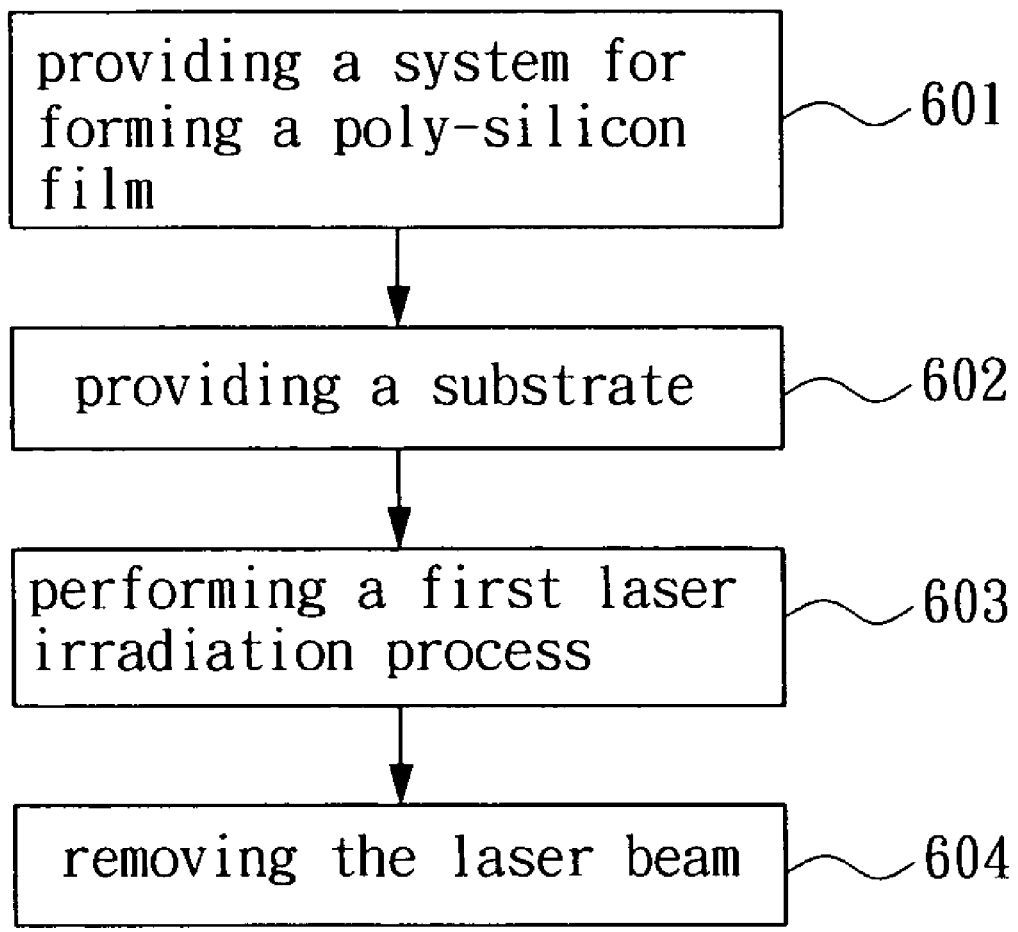
FIG. 6 is a flow-chart showing a method for forming a poly-silicon film according to a first embodiment of the present invention.

Therefore, the present invention provides a method for forming a poly-silicon film using the optical device 41 in FIG. 4A or the optical device 42 in FIG. 4B. The method comprises steps with reference to the steps described in FIG. 6, which is a flow-chart showing a method for forming a poly-silicon film according to a first embodiment of the present invention.

Figure 1A:
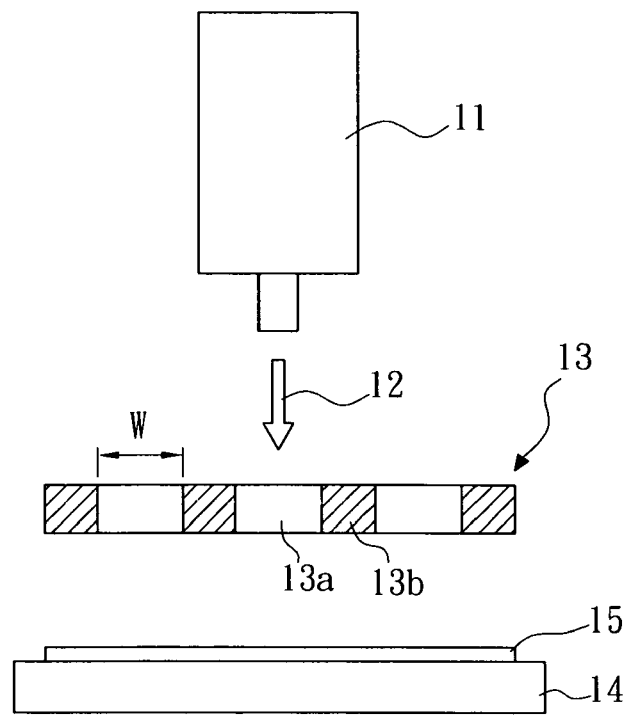
FIG. 1A is a conventional system for forming a poly-silicon film using sequential lateral solidification (SLS)
Figure 1B:
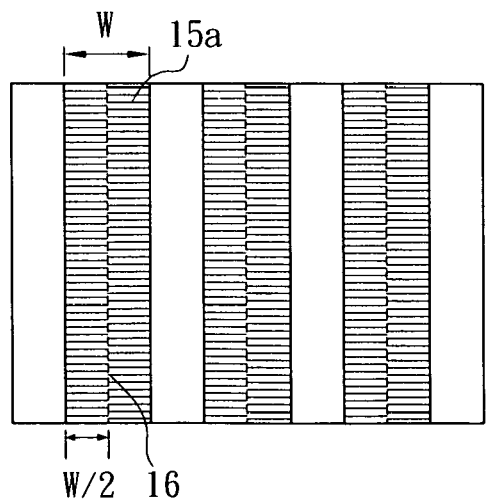
FIG. 1B is a top view of a poly-silicon film formed using the system in FIG. 1A.
Figure 2A:
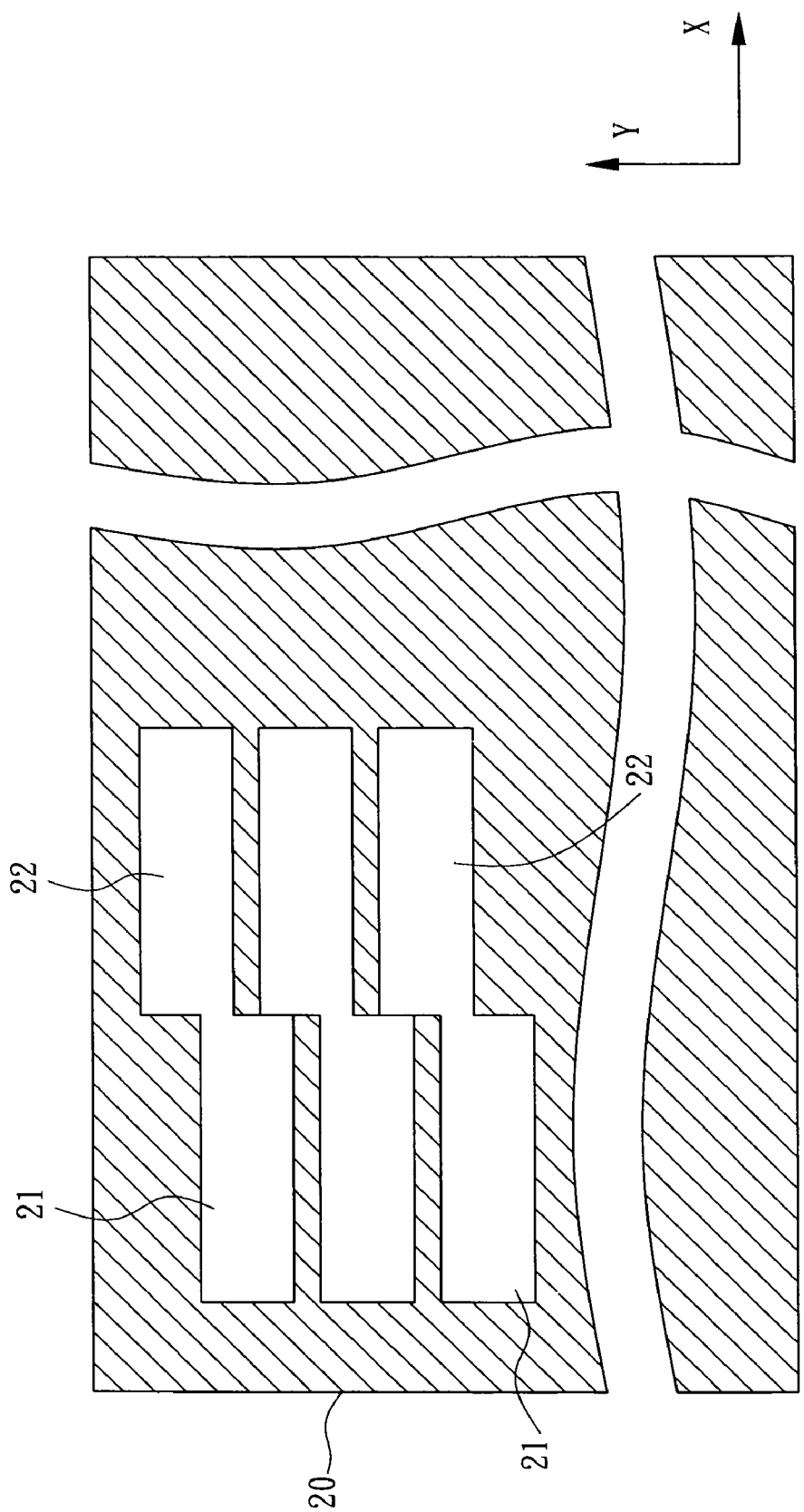
FIG. 2A is a top view of an optical device disclosed in U.S. Pat. No. 6,908,835.
Figure 2B:
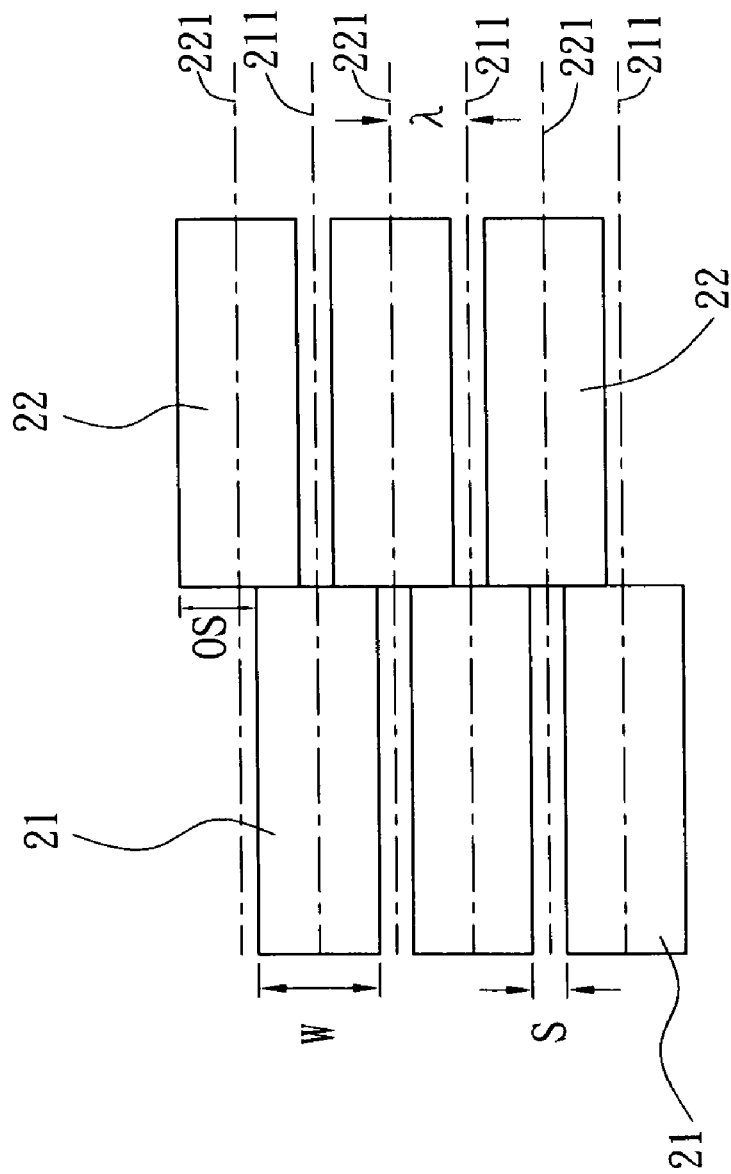
FIG. 2B is an enlarged top view with detailed specification of the mask in FIG. 2A.
Figure 2C:
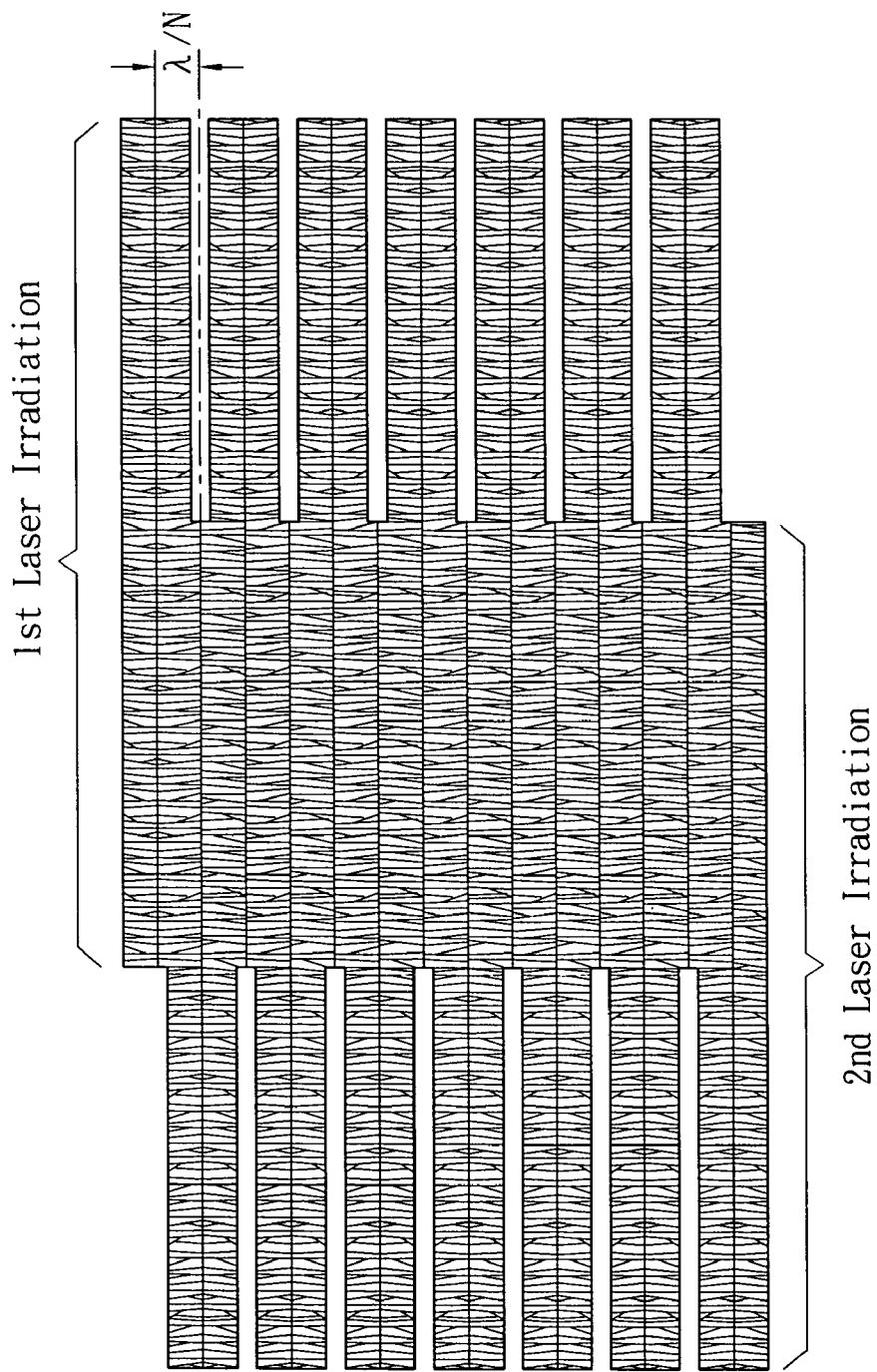
FIG. 2C is a top view of a poly-silicon film formed using the method using sequential lateral solidification with two laser irradiations disclosed in U.S. Pat. No. 6,908,835.
Figure 3C:
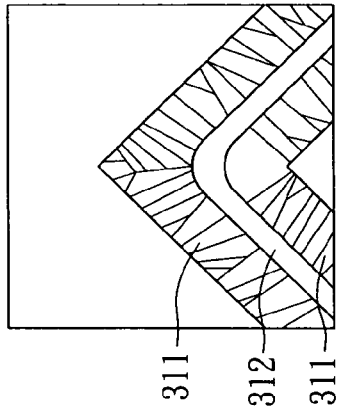
FIG. 3A to FIG. 3F are schematic diagrams showing a flow-chart of a method for forming a poly-silicon film disclosed in U.S. Pat. No. 6,322,625.
Figure 3B:
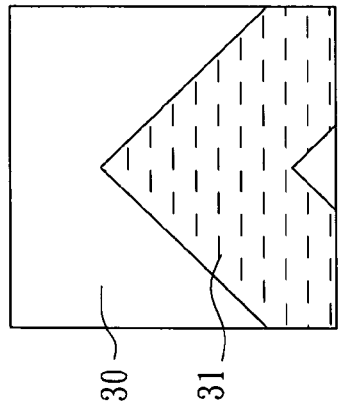
Figure 3A:
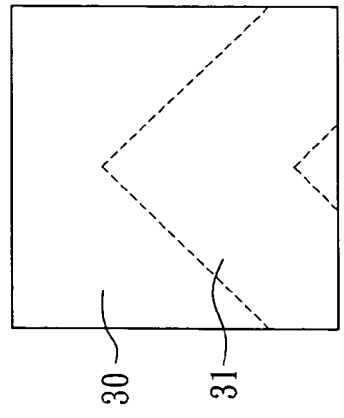
Figure 3F:
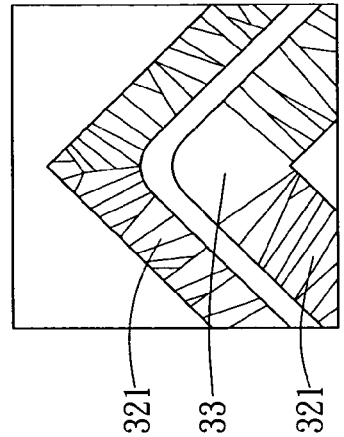
Figure 3E:
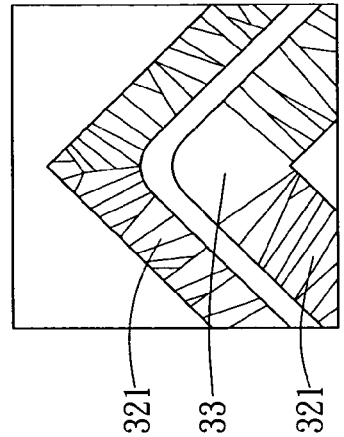
Figure 3D:
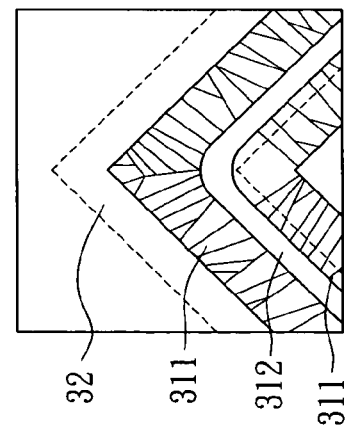

To begin with, in Step 601, a system for forming a poly-silicon film is provided to comprise a laser generator for generating a laser beam and an optical device. The system is similar to the conventional one shown in FIG. 1 and description thereof is not repeated. However, the optical device employed in the present invention is shown in FIG. 4A or FIG. 4B.

Then in Step 602, a substrate with an amorphous silicon film (not shown) formed thereon is provided in back of the optical device in the traveling path of the laser beam.

In Step 603, a first laser irradiation process is performed on the substrate using the laser beam irradiating through the optical device 41 or 42 so as to melt the amorphous silicon film in irradiated regions corresponding to the first transparent regions 411 on the optical device 41 or the first transparent regions 421 on the optical device 42.

Then, the laser beam is removed such that the melted amorphous silicon film in the irradiated regions solidifies by SLS to form poly-silicon regions with poly-silicon grains having a first grain length and a first grain width, as described in Step 604.

In practical cases, however, the system for forming a poly-silicon film described in Step 601 further comprises a projection lens apparatus (not shown) with an amplification factor of N, the projection lens apparatus being disposed on the traveling path of the laser beam between the substrate and the optical device so as to improve the optical resolution during exposure.

Even though the present invention is described with reference to the first embodiment, the present invention is not limited to the first embodiment and people with ordinary skills in the art can make various modifications within the scope of the present invention.

Figure 7A:
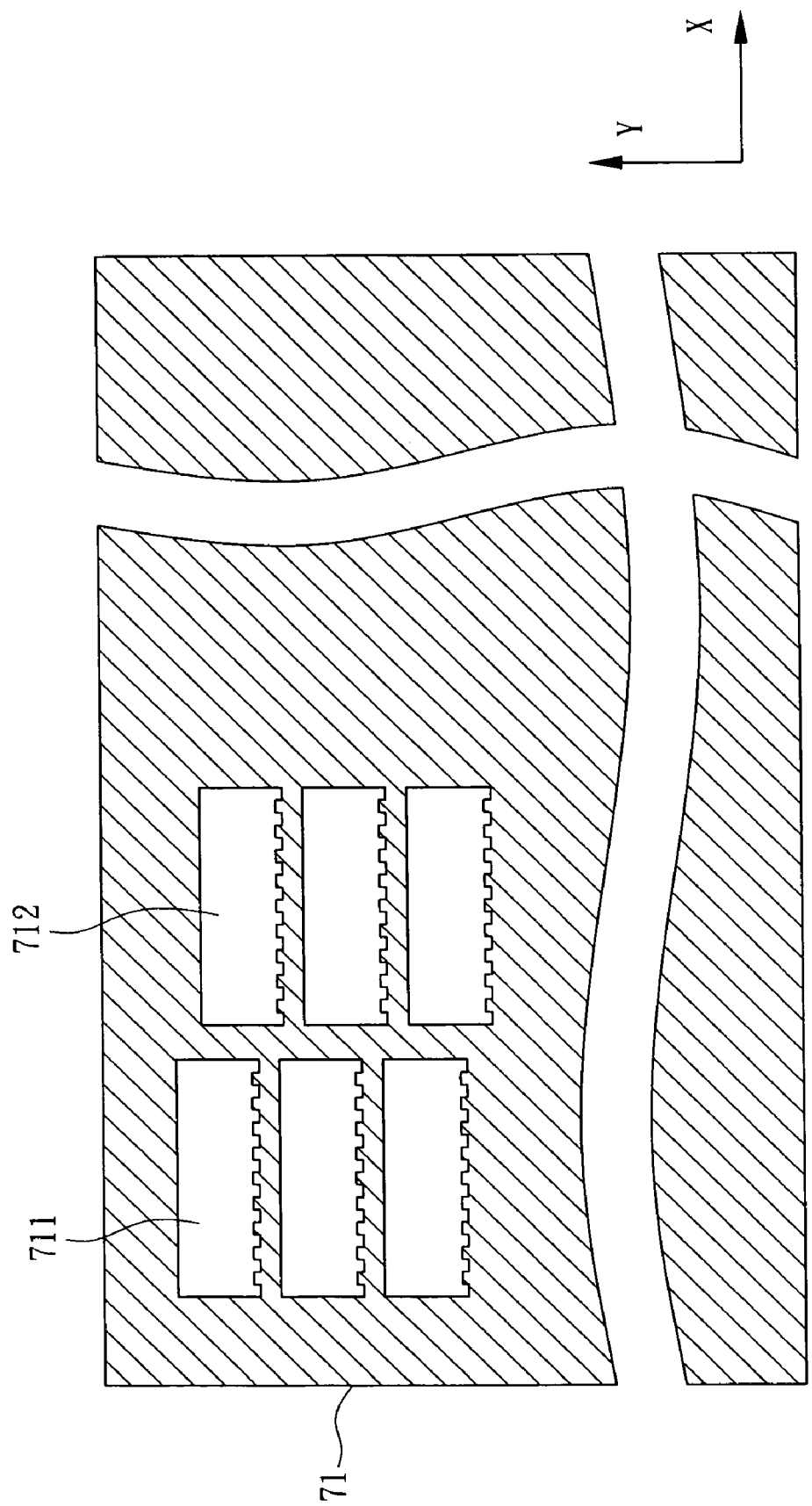
FIG. 7A and FIG. 7B are top views of masks used in a method for forming a poly-silicon film according to a second embodiment of the present invention.
Figure 7B:
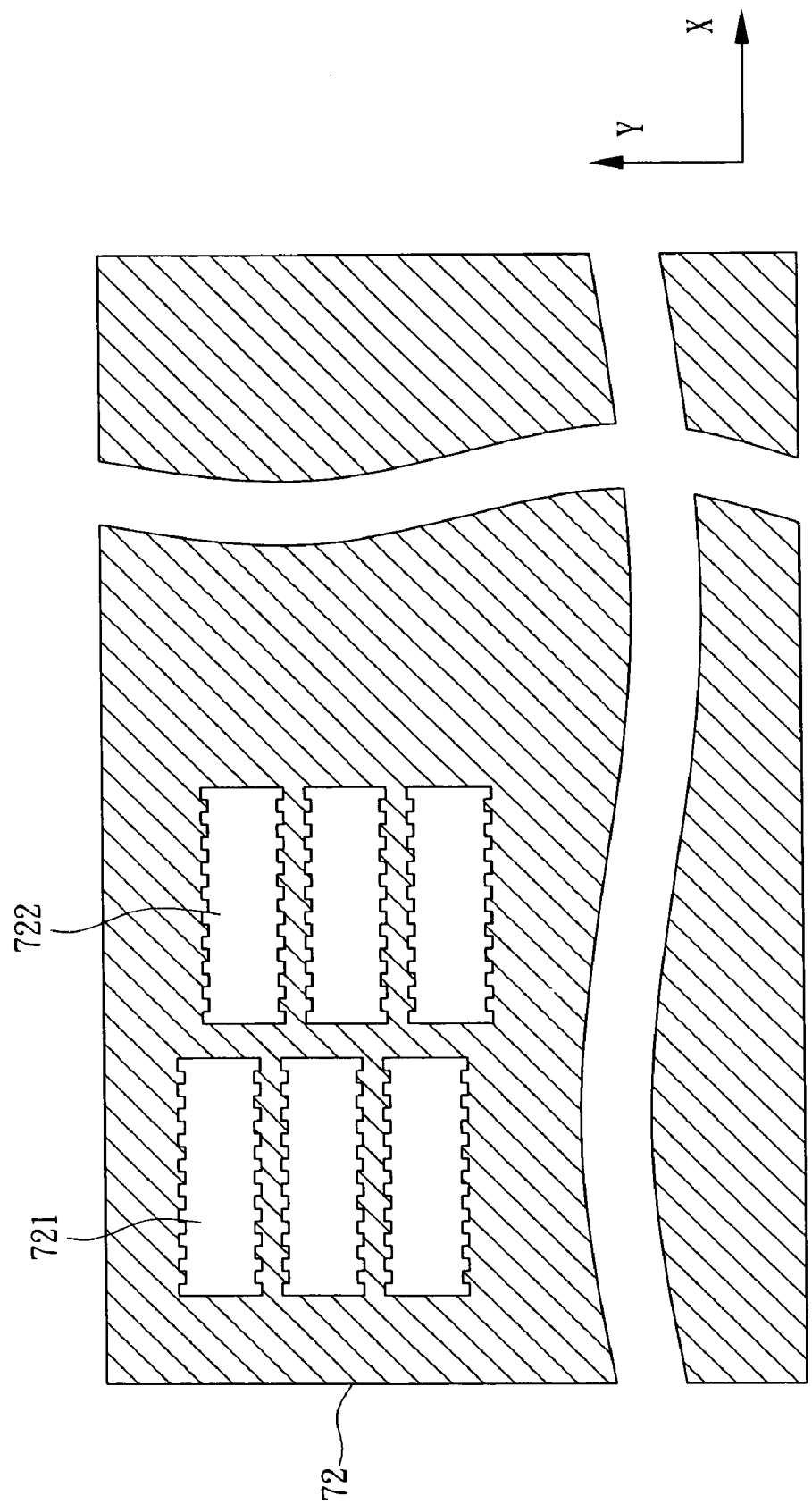

For example, FIG. 7A and FIG. 7B are top views of masks used in a method for forming a poly-silicon film according to a second embodiment of the present invention. In FIG. 7A, the optical device 71 (for example, a mask or a micro-slit array) comprises a plurality of first transparent regions 711 and a plurality of second transparent regions 712 so that the plurality of first transparent regions 711 and the plurality of second transparent regions 712 are arranged in a tier-shape. More particularly, each of the first transparent regions 711 has a first periodic shape on an edge region and each of the second transparent regions 712 has a second periodic shape on an edge region. Alternatively, as shown in FIG. 7B, the optical device 72 (for example, a mask or a micro-slit array) comprises a plurality of first transparent regions 721 and a plurality of second transparent regions 722 so that the plurality of first transparent regions 721 and the plurality of second transparent regions 722 are arranged in a tier-shape. More particularly, each of the first transparent regions 721 has a first periodic shape on each of two opposite edge regions and each of the second transparent regions 722 has a second periodic shape on each of two opposite edge regions.

In the present embodiment, the first periodic shape and the second periodic shape can each be any example shown in FIG. 5A to FIG. 5D. The aforesaid examples are only exemplary and people with ordinary skills in the art can make various modifications, for example a zigzag shape and a sawtooth shape, within the scope of the present invention.

Figure 8:
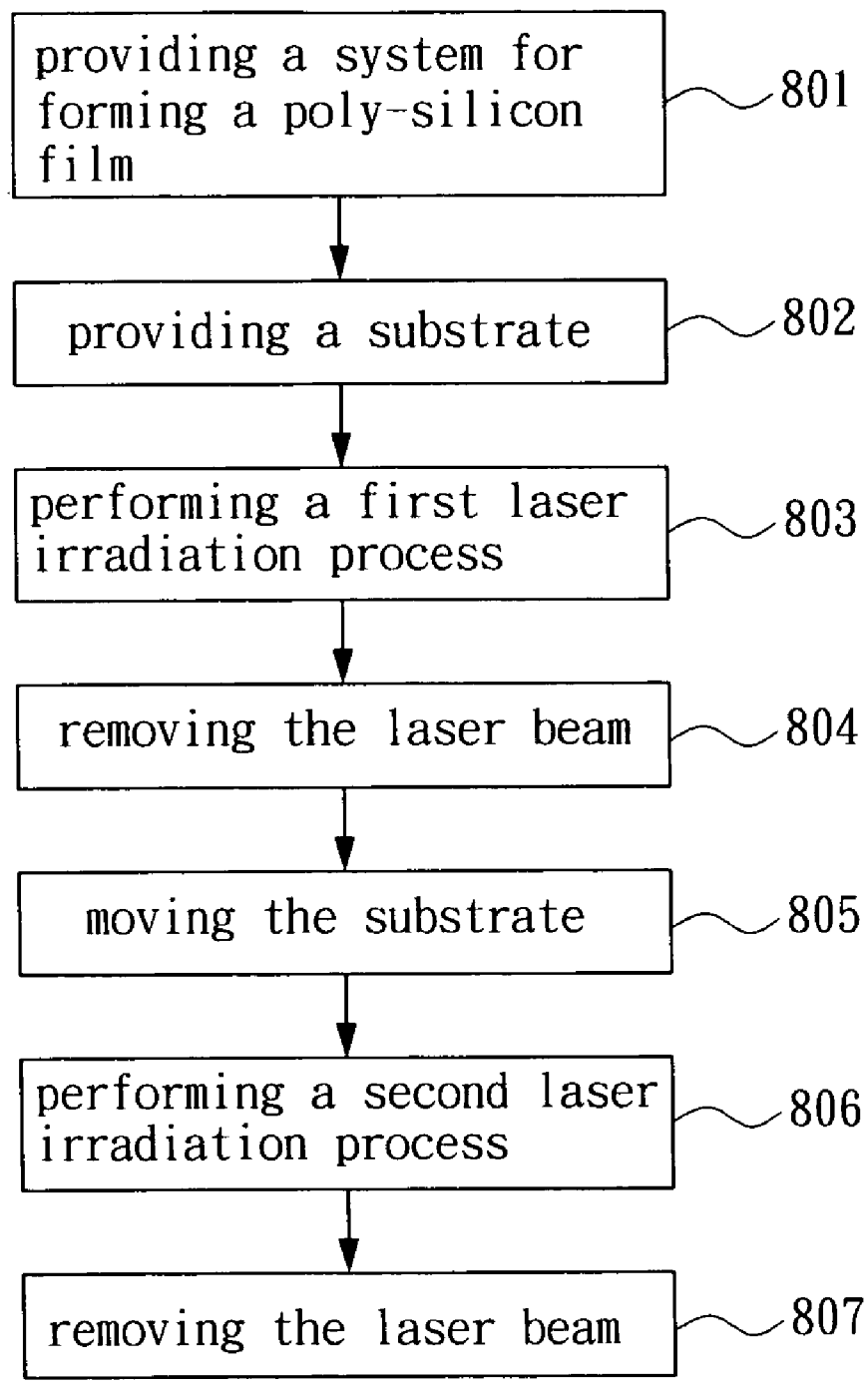
FIG. 8 is a flow-chart showing a method for forming a poly-silicon film according to a second embodiment of the present invention.

Therefore, the present invention provides a method for forming a poly-silicon film using the optical device 71 in FIG. 7A or the optical device 72 in FIG. 7B. The method comprises steps with reference to the steps described in FIG. 8, which is a flow-chart showing a method for forming a poly-silicon film according to a second embodiment of the present invention.

To begin with, in Step 801, a system for forming a poly-silicon film is provided to comprise a laser generator for generating a laser beam and an optical device. The system is similar to the conventional one shown in FIG. 1 and description thereof is not repeated. However, the optical device employed in the present invention is shown in FIG. 7A or FIG. 7B.

Then in Step 802, a substrate with an amorphous silicon film (not shown) formed thereon is provided in back of the optical device in the traveling path of the laser beam.

In Step 803, a first laser irradiation process is performed on the substrate using the laser beam irradiating through the optical device 71 or 72 so as to melt the amorphous silicon film in irradiated regions corresponding to the first transparent regions 711 on the optical device 71 or the first transparent regions 721 on the optical device 72.

Then, the laser beam is removed such that the melted amorphous silicon film in the irradiated regions solidifies by SLS to form poly-silicon regions with poly-silicon grains having a first grain length and a first grain width, as described in Step 804.

In Step 805, the substrate is moved so that the substrate is to be irradiated in irradiated regions corresponding to the second transparent regions 712 on the optical device 71 or the second transparent regions 722 on the optical device 72.

Then in Step 806, a second laser irradiation process is performed on the substrate using the laser beam irradiating through the optical device 71 or 72 so as to melt the amorphous silicon film in irradiated regions and the solidified poly-silicon regions corresponding to the second transparent regions 712 on the optical device 71 or the second transparent regions 722 on the optical device 72.

In Step 807, the laser beam is removed such that the melted amorphous silicon film and poly-silicon regions in the irradiated regions solidify to form poly-silicon regions.

In practical cases, however, the system for forming a poly-silicon film described in Step 801 further comprises a projection lens apparatus (not shown) with an amplification factor of N, the projection lens apparatus being disposed on the traveling path of the laser beam between the substrate and the optical device so as to improve the optical resolution during exposure.

Even though the present invention is described with reference to the second embodiment, the present invention is not limited to the second embodiment and people with ordinary skills in the art can make various modifications within the scope of the present invention.

Figure 9A:
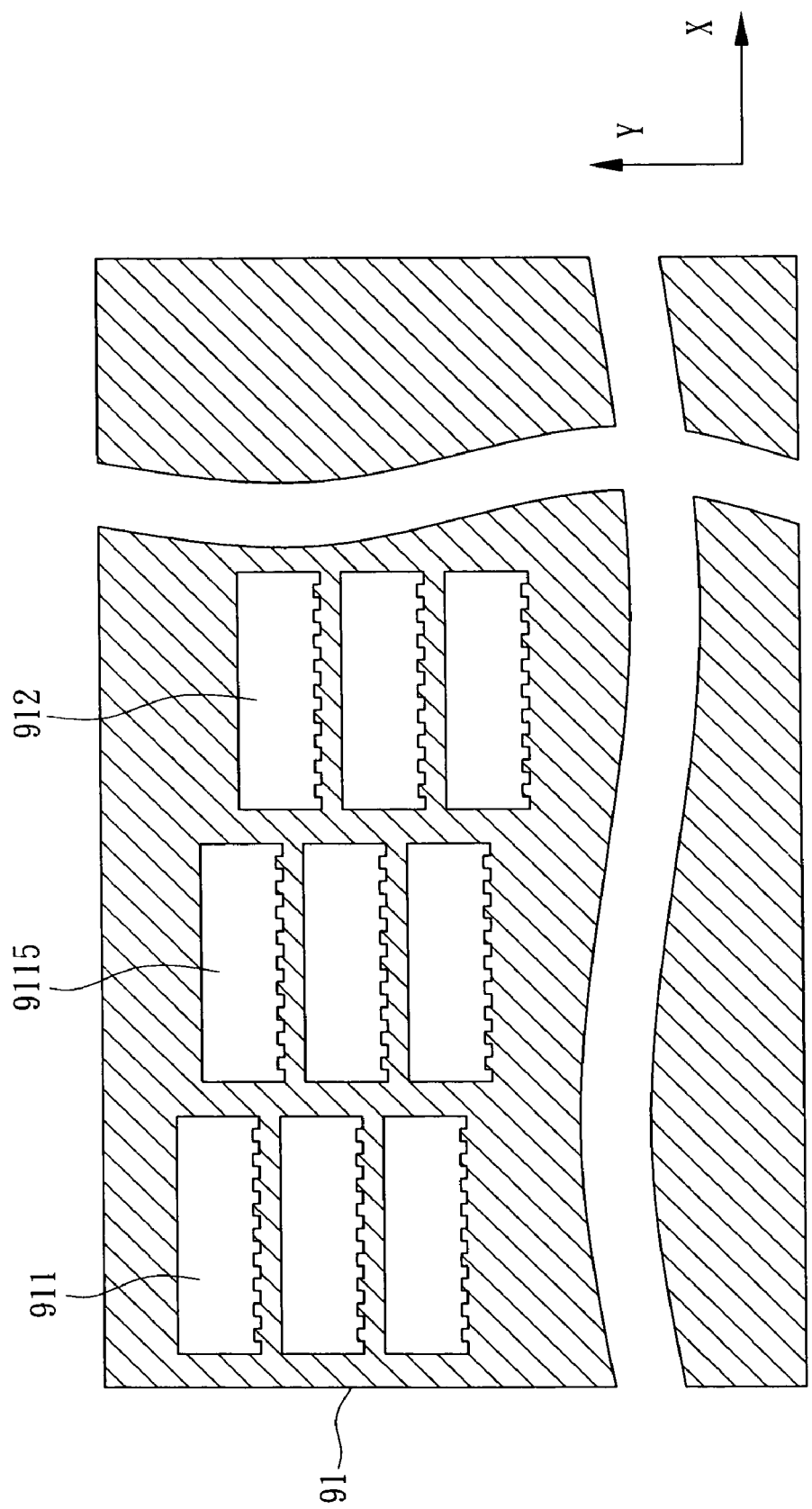
FIG. 9A and FIG. 9B are top views of masks used in a method for forming a poly-silicon film according to a third embodiment of the present invention.
Figure 9B:
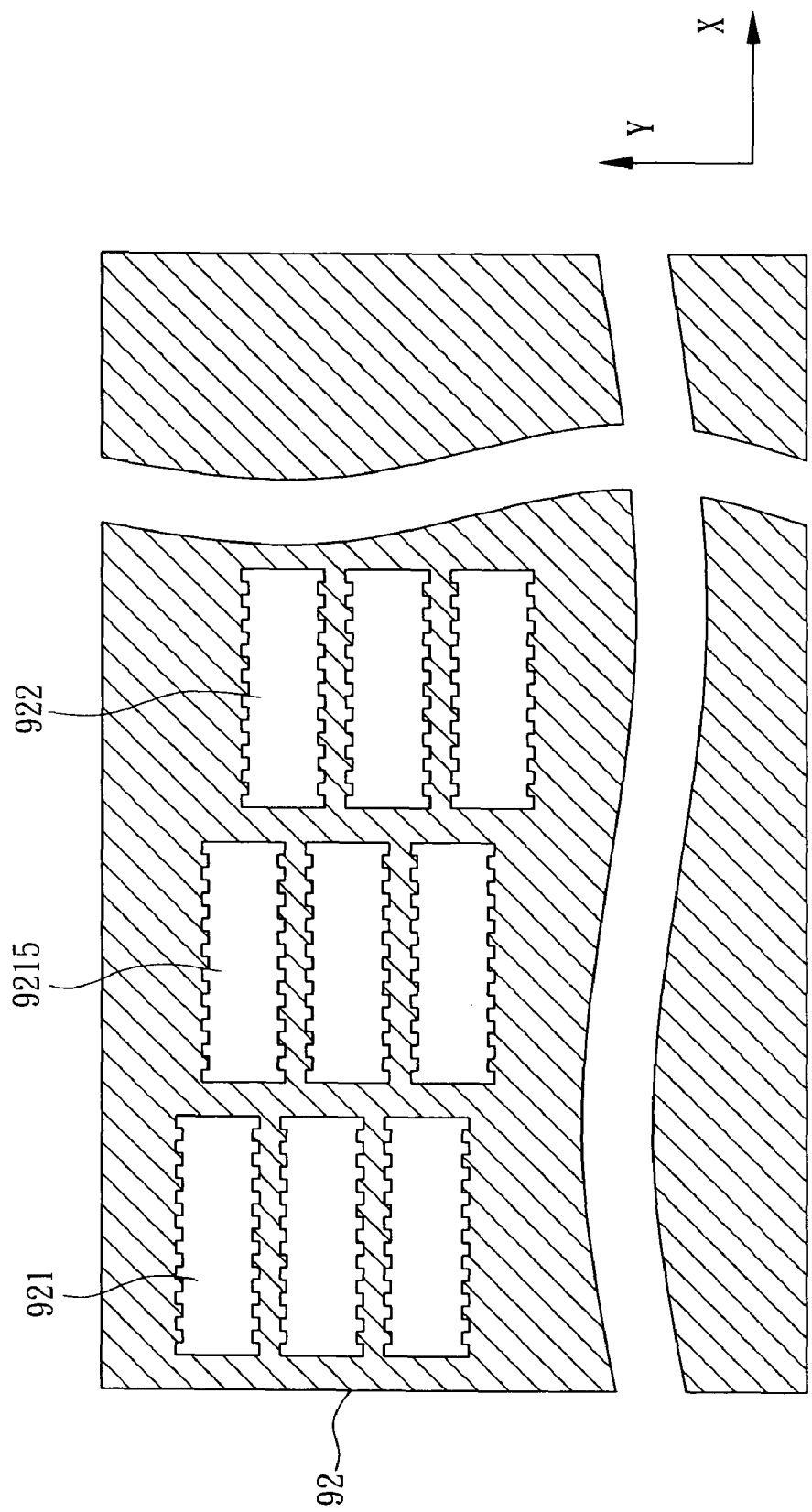

For example, FIG. 9A and FIG. 9B are top views of masks used in a method for forming a poly-silicon film according to a third embodiment of the present invention. In FIG. 9A, the optical device 91 (for example, a mask or a micro-slit array) comprises a plurality of first transparent regions 911, a plurality of second transparent regions 912 and at least a plurality of extended transparent regions 9115. The plurality of extended transparent regions 9115 are disposed between the plurality of first transparent regions 911 and the plurality of second transparent regions 912 so that the plurality of first transparent regions 911, the plurality of extended transparent regions 9115 and the plurality of second transparent regions 912 are arranged in a tier-shape. More particularly, each of the first transparent regions 911 has a first periodic shape on an edge region, each of the second transparent regions 912 has a second periodic shape on an edge region and each of the extended transparent regions 9115 has a third periodic shape on an edge region. Alternatively, as shown in FIG. 9B, the optical device 92 (for example, a mask or a micro-slit array) comprises a plurality of first transparent regions 921, a plurality of second transparent regions 922 and at least a plurality of extended transparent regions 9215. The plurality of extended transparent regions 9215 are disposed between the plurality of first transparent regions 921 and the plurality of second transparent regions 922 so that the plurality of first transparent regions 921, the plurality of extended transparent regions 9215 and the plurality of second transparent regions 922 are arranged in a tier-shape. More particularly, each of the first transparent regions 921 has a first periodic shape on each of two opposite edge regions, each of the second transparent regions 922 has a second periodic shape on each of two opposite edge regions and each of the extended transparent regions 9215 has a third periodic shape on each of two opposite edge regions.

In the present embodiment, the first periodic shape, the second periodic shape and the third periodic shape can each be any example shown in FIG. 5A to FIG. 5D. The aforesaid examples are only exemplary and people with ordinary skills in the art can make various modifications, for example a zigzag shape and a sawtooth shape, within the scope of the present invention.

Figure 10:
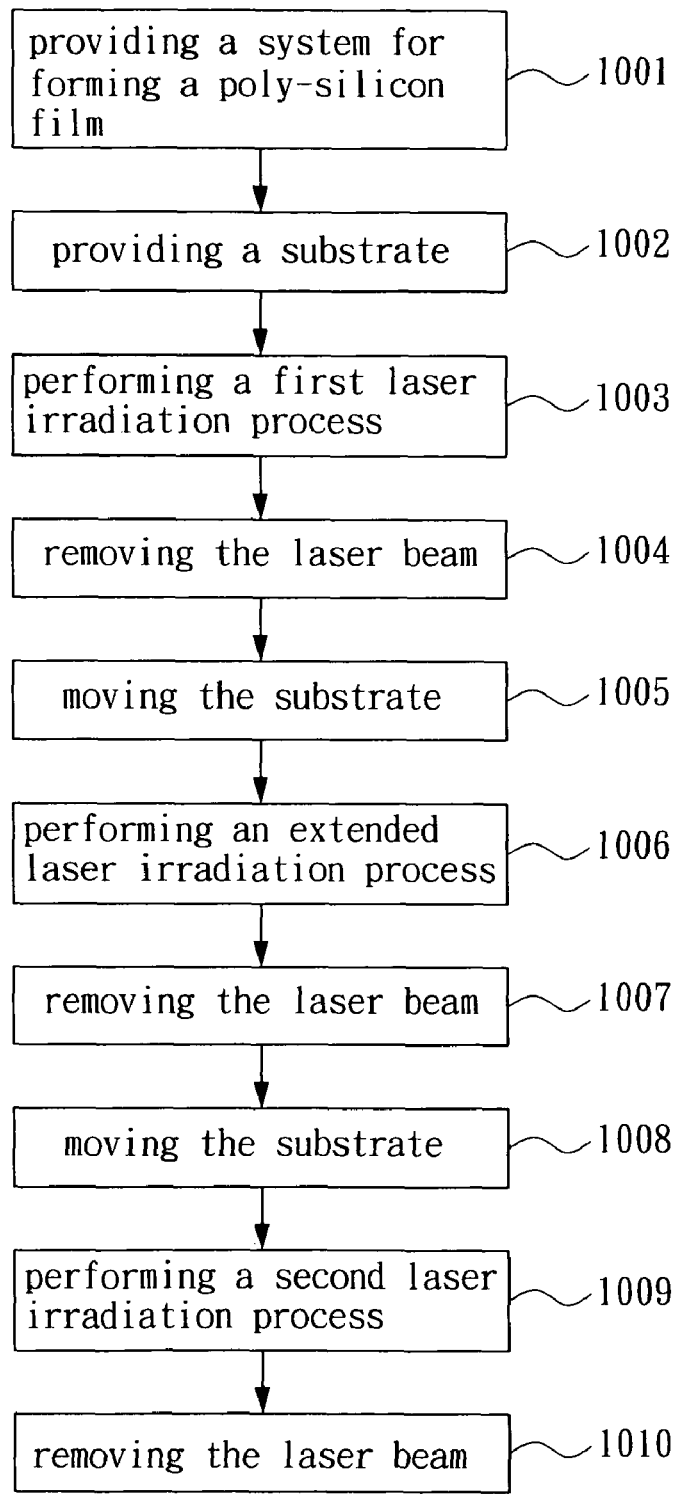
FIG. 10 is a flow-chart showing a method for forming a poly-silicon film according to a third embodiment of the present invention.

Therefore, the present invention provides a method for forming a poly-silicon film using the optical device 91 in FIG. 9A or the optical device 92 in FIG. 9B. The method comprises steps with reference to the steps described in FIG. 10, which is a flow-chart showing a method for forming a poly-silicon film according to a third embodiment of the present invention.

To begin with, in Step 1001, a system for forming a poly-silicon film is provided to comprise a laser generator for generating a laser beam and an optical device. The system is similar to the conventional one shown in FIG. 1 and description thereof is not repeated. However, the optical device employed in the present invention is shown in FIG. 9A or FIG. 9B.

Then in Step 1002, a substrate with an amorphous silicon film (not shown) formed thereon is provided in back of the optical device in the traveling path of the laser beam.

In Step 1003, a first laser irradiation process is performed on the substrate using the laser beam irradiating through the optical device 91 or 92 so as to melt the amorphous silicon film in irradiated regions corresponding to the first transparent regions 911 on the optical device 91 or the first transparent regions 921 on the optical device 92.

Then, the laser beam is removed such that the melted amorphous silicon film in the irradiated regions solidifies by SLS to form poly-silicon regions with poly-silicon grains having a first grain length and a first grain width, as described in Step 1004.

In Step 1005, the substrate is moved so that the substrate is to be irradiated in irradiated regions corresponding to the extended transparent regions 9115 on the optical device 91 or the extended transparent regions 9215 on the optical device 92.

Then in Step 1006, an extended laser irradiation process is performed on the substrate using the laser beam irradiating through the optical device 91 or 92 so as to melt the amorphous silicon film in irradiated regions and the solidified poly-silicon regions corresponding to the extended transparent regions 9115 on the optical device 91 or the extended transparent regions 9215 on the optical device 92.

In Step 1007, the laser beam is removed such that the melted amorphous silicon film and poly-silicon regions in the irradiated regions solidify to form poly-silicon regions.

In Step 1008, the substrate is moved so that the substrate is to be irradiated in irradiated regions corresponding to the second transparent regions 912 on the optical device 91 or the second transparent regions 922 on the optical device 92.

Then in Step 1009, a second laser irradiation process is performed on the substrate using the laser beam irradiating through the optical device 91 or 92 so as to melt the amorphous silicon film in irradiated regions and the solidified poly-silicon regions corresponding to the second transparent regions 912 on the optical device 91 or the second transparent regions 922 on the optical device 92.

In Step 1010, the laser beam is removed such that the melted amorphous silicon film and poly-silicon regions in the irradiated regions solidify to form poly-silicon regions.

In practical cases, however, the system for forming a poly-silicon film described in Step 1001 further comprises a projection lens apparatus (not shown) with an amplification factor of N, the projection lens apparatus being disposed on the traveling path of the laser beam between the substrate and the optical device so as to improve the optical resolution during exposure.

According to the above discussion, it is apparent that the present invention discloses a method for forming a poly-silicon film using sequential lateral solidification (SLS) by laser irradiation through an optical device (for example, a mask or a micro-slit array) to pattern the laser beam and provide a periodic energy profile of the edge of the laser beam passing through the optical device so as to widen the poly-silicon grains and achieve grain size uniformity. Therefore, the present invention is novel, useful and non-obvious.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for forming a poly-silicon film, the method comprising steps of:
   providing a system for forming a poly-silicon film, comprising:
   a laser generator for generating a laser beam; and
   an optical device disposed in a traveling path of the laser beam so as to provide a periodic energy profile of at least a long-side edge of the laser beam passing through the optical device;
   providing a substrate with an amorphous silicon film formed thereon behind the optical device in the traveling path of the laser beam;
   performing a first laser irradiation process on the substrate using the laser beam irradiating through the optical device so as to melt the amorphous silicon film in irradiated regions; and
   removing the laser beam such that the melted amorphous silicon film in the irradiated regions solidifies to form poly-silicon regions,
   wherein the optical device comprises a plurality of first transparent regions, each of the first transparent regions having a first periodic shape on at least a long-side edge region thereof.

2. The method as recited in claim 1, wherein the optical device is a mask or a micro-slit array.

3. The method as recited in claim 1, wherein the first periodic shape is a full-wave shape, a sawtooth shape, a zigzag shape or a half-wave shape.

4. The method as recited in claim 1, wherein the system further comprises a projection lens apparatus with an amplification factor of N, the projection lens apparatus being disposed on the traveling path of the laser beam between the substrate and the optical device.

5. The method as recited in claim 1, further comprising steps of
   moving the substrate;
   performing a second laser irradiation process on the substrate using the laser beam irradiating through the optical device so as to melt the amorphous silicon film in irradiated regions and the solidified poly-silicon regions; and
   removing the laser beam such that the melted amorphous silicon film and poly-silicon regions in the irradiated regions solidify to form poly-silicon regions.

6. The method as recited in claim 5, wherein the optical device is a mask or a micro-slit array.

7. The method as recited in claim 5, wherein the system further comprises a projection lens apparatus with an amplification factor of N, the projection lens apparatus being disposed on the traveling path of the laser beam between the substrate and the optical device.

8. The method as recited in claim 5, wherein the optical device comprises:
   a plurality of first transparent regions, each of the first transparent regions having a first periodic shape on at least a long-side edge region thereof; and
   a plurality of second transparent regions, each of the second transparent regions having a second periodic shape on at least a long-side edge region thereof;
   wherein the plurality of first transparent regions and the plurality of second transparent regions are arranged in a tier-shape.

9. The method as recited in claim 8, wherein the first periodic shape and the second periodic shape are respectively a full-wave shape, a sawtooth shape, a zigzag shape or a half-wave shape.

10. The method as recited in claim 5, further comprising, prior to the step of moving the substrate, the steps of:
    moving the substrate;
    performing an extended laser irradiation process on the substrate using the laser beam irradiating through the optical device so as to melt the amorphous silicon film in irradiated regions and the solidified poly-silicon regions; and
    removing the laser beam such that the melted amorphous silicon film and poly-silicon regions in the irradiated regions solidify to form poly-silicon regions.

11. The method as recited in claim 10, wherein the optical device is a mask or a micro-slit array.

12. The method as recited in claim 10, wherein the system further comprises a projection lens apparatus with an amplification factor of N, the projection lens apparatus being disposed on the traveling path of the laser beam between the substrate and the optical device.

13. The method as recited in claim 10, wherein the optical device comprises:
    a plurality of first transparent regions, each of the first transparent regions having a first periodic shape on at least a long-side edge region thereof;
    a plurality of second transparent regions, each of the second transparent regions having a second periodic shape on at least a long-side edge region thereof; and
    at least a plurality of extended transparent regions, each of the extended transparent regions having a third periodic shape on at least a long-side edge region thereof;
    wherein the plurality of extended transparent regions are disposed between the plurality of first transparent regions and the plurality of second transparent regions so that the plurality of first transparent regions, the plurality of extended transparent regions and the plurality of second transparent regions are arranged in a tier-shape.

14. The method as recited in claim 13, wherein the first periodic shape, the second periodic shape and the third periodic shape are respectively a full-wave shape, a sawtooth shape, a zigzag shape or a half-wave shape.

15. An optical device for forming a poly-silicon film, the optical device comprising:
    a plurality of first transparent regions, each of the first transparent regions having a first periodic shape on at least a long-side edge region thereof; and
    a plurality of second transparent regions, each of the second transparent regions having a second periodic shape on at least a long-side edge region thereof;
    wherein the plurality of first transparent regions and the plurality of second transparent regions are arranged in a tier-shape.

16. The optical device as recited in claim 15, wherein the first periodic shape is a lull-wave shape, a sawtooth shape, a zigzag shape or a half-wave shape.

17. The optical device as recited in claim 15, wherein the optical device is a mask or a micro-slit array.

18. The optical device as recited in claim 15, wherein the first periodic shape and the second periodic shape are respectively a full-wave shape, a sawtooth shape, a zigzag shape or a half-wave shape.

19. The optical device as recited in claim 15, further comprising:
  at least a plurality of extended transparent regions, each of the extended transparent regions having a third periodic shape on at least a long-side edge region thereof;
  wherein the plurality of extended transparent regions are disposed between the plurality of first transparent regions and the plurality of second transparent regions so that the plurality of first transparent regions, the plurality of extended transparent regions and the plurality of second transparent regions are arranged in a tier-shape.

20. The optical device as recited in claim 19, wherein the optical device is a mask or a micro-slit array.

21. The optical device as recited in claim 19, wherein the first periodic shape, the second periodic shape and the third periodic shape are respectively a full-wave shape, a sawtooth shape, a zigzag shape or a half-wave shape.

\* \* \* \* \*